United States Patent [19]
Sekimoto

[11] Patent Number: 5,990,711
[45] Date of Patent: Nov. 23, 1999

[54] CONSTANT CURRENT DRIVING CIRCUIT

[75] Inventor: Yasuhiko Sekimoto, Hamamatsu, Japan

[73] Assignee: Yamaha Corporation, Shizuoka-ken, Japan

[21] Appl. No.: 09/040,419

[22] Filed: Mar. 18, 1998

[30] Foreign Application Priority Data

Mar. 21, 1997 [JP] Japan ................................. 9-068473

[51] Int. Cl.$^6$ .................................................. H03K 3/00
[52] U.S. Cl. ........................ 327/112; 327/382; 327/513; 323/316
[58] Field of Search .................................. 327/108, 109, 327/110, 111, 112, 382, 436, 437, 513; 323/316; 330/253, 255

[56] References Cited

U.S. PATENT DOCUMENTS 4,931,797  6/1990  Kagawa et al. ........................ 341/162
5,638,011  6/1997  Nguyen ................................. 327/108

FOREIGN PATENT DOCUMENTS 62-290213  12/1987  Japan .
3-259496  11/1991  Japan .
4-117716   4/1992  Japan .

Primary Examiner—Kenneth B. Wells
Assistant Examiner—Minh Nguyen
Attorney, Agent, or Firm—Hazel & Thomas, P.C.

[57] ABSTRACT

A constant current driving circuit capable of performing constant current driving of a load without being influenced by power supply variation, temperature variation and process variation, while reducing the output amplitude on the high level side. The circuit includes a high-level power supply terminal, a low-level power supply terminal, a reference current source circuit, and a switching drive stage.

15 Claims, 7 Drawing Sheets

IN1,IN2

VC,VD

VCD

CONSTANT CURRENT DRIVING CIRCUIT

BACKGROUND OF THE INVENTION

1. Field of the Invention

This invention relates to a constant current driving circuit which is capable of performing constant current driving of a load without being influenced by power supply variation, temperature variation and process variation.

2. Prior Art

Conventionally, to transfer signals between internal circuits of two IC chips, an off-chip driver is sometimes employed. Such an off-chip driver includes a constant current driving circuit as shown in FIG. 1, which uses current mirror circuits, and is free from the influence of power supply variation, temperature variation and process variation.

The conventional constant current driving circuit has a reference current source circuit formed of an operational amplifier OP which has an inverting input terminal thereof supplied with reference voltage VREF, a PMOS transistor P21 driven by an output from the operational amplifier OP, and a resistance R connected to a drain terminal A of the PMOS transistor P21. In the reference current source circuit, the output from the operational amplifier OP is negatively fed back by the PMOS transistor P21 such that voltage at the terminal A is always equal to the reference voltage VREF. Therefore, provided that the reference voltage VREF is free from the influence of power supply variation, temperature variation and process variation, a current I0 (=VREF/R) flowing through the resistance R is also free from the influence of power supply variation, temperature variation and process variation, which is therefore used as a reference current.

In the conventional constant current driving circuit, PMOS transistors P22 and P23 have their gates commonly connected to the gate of the PMOS transistor P21 such that they are commonly driven by the output from the operational amplifier OP, to form a current mirror circuit together with the PMOS transistor P21. If the PMOS transistors P22 and P23 have the same element size (element parameter) as that of the PMOS transistor P21, currents I1 and I2 flowing through the respective PMOS transistors P22 and P23 become equal to the current I0. An NMOS transistor N21 is connected to the drain of the PMOS transistor P22, with its source connected to a grounding terminal VSS. This transistor has its gate and drain connected to each other (diode connection), to serve as a diode. The thus connected gate and drain of the transistor N21 are connected to the gate of an NMOS transistor N22 forming an output stage of the circuit. Thus, the NMOS transistors N21 and N22 also form a current mirror circuit, and provided that they have the same element size, a current I3 flowing through the NMOS transistor N22 becomes equal to the current I0. A switching PMOS transistor P24 and a switching NMOS transistor N23 are connected between the PMOS transistor P23 and the NMOS transistor N22, for connection to a load.

With the above arrangement, when the switching transistors P24 and N23 are driven in a complementary manner by input signals IN1 and IN2, the load is driven with a constant current. That is, when the PMOS transistor P24 is on, the load is charged from the power supply VDD via the PMOS transistors P23 and P24 with the constant current I2=I0. On the other hand, if the NMOS transistor N23 is on, the load is discharged via the NMOS transistors N22 and N23 with the constant current I3=I0.

In the conventional constant current driving circuit, when the load is charged, the PMOS transistors P23 and P24 do not have voltage drops by threshold values, and consequently an output signal at a signal output terminal OUT fully swings, i.e. the output voltage rises to a level as high as the supply voltage VDD. In recent days, however, for the economy of power consumption, it is often demanded to lower the output amplitude below the power supply voltage. To cope with such a demand, it is generally effective to provide an NMOS transistor on the side of the power supply VDD. With the NMOS transistor provided on the VDD side, when the gate of the NMOS transistor is driven with the supply voltage VDD, voltage at the source of the NMOS transistor cannot rise in excess of a value VDD−Vth (where Vth represents the gate threshold voltage of the NMOS transistor). Thus, the output at the output terminal OUT is limited on the high level side.

However, if the circuit design is changed such that the reference voltage VREF is input to the non-inverting input terminal of the operational amplifier OP and at the same time the PMOS transistors P21, P22, and P23 on the VDD side are replaced by NMOS transistors N31, N32, and N33, respectively, these NMOS transistors do not form a current mirror circuit, so that a constant current characteristic is no more obtained. More specifically, in the FIG. 1 circuit, the PMOS transistors P21, P22, and P23 have their sources connected to the power supply VDD and commonly connected such that they always have the same voltage between the gate and source (gate-source voltage) to thereby satisfy current mirror circuit conditions. On the other hand, in the FIG. 2 circuit, a reference current source circuit is formed of an operational amplifier OP, the NMOS transistor N31, and a resistance R, wherein a constant reference current I0=VREF/R is obtained by the negative feedback operation of the NMOS transistor N31. However, the NMOS transistors N32 and N33 have their drains connected to the power supply VDD side and therefore they do not have always the same voltage between the gate and source. Thus, the current mirror circuit conditions are not satisfied.

Even if the circuit is designed such that a current I1=VREF/R flows through the NMOS transistor N21 with its gate and drain connected to each other under a condition that the temperature variation and process variation each fall within a standard range, the current I1 and a current I2 flowing through the NMOS transistors N32 and N33 cannot always be equal to the reference current I0 flowing through the resistance R when the temperature variation and/or process variation falls out of the standard range. This is the same case as the output NMOS transistor N22 of the output stage connected to the grounding terminal VSS. That is, although the connection between the NMOS transistors N21 and N22 is the same as in the FIG. 1 circuit and therefore only a relationship of I1=I3 is satisfied, the relationship of I0=I1=I3 is not always satisfied.

As described hereinabove, according to the conventional constant current driving circuit using the PMOS current mirror circuit, the output amplitude on the high level side cannot be limited, and if the PMOS transistors forming the current mirror circuit are replaced by NMOS transistors, the circuit can be influenced by temperature variation and process variation.

SUMMARY OF THE INVENTION

It is the object of the invention to provide a constant current driving circuit which is capable of driving a load with constant current without being influenced by power supply variation, temperature variation and process variation, while reducing the output amplitude on the high level side.

To attain the above object, the present invention provides a constant current driving circuit comprising a high-level power supply terminal, a low-level power supply terminal, a reference current source circuit including a first operational amplifier having a non-inverting input terminal and an inverting input terminal, one of the non-inverting input terminal and the inverting input terminal being supplied with a first reference voltage, a second operational amplifier having a non-inverting input terminal and an inverting input terminal, one of the non-inverting input terminal and the inverting input terminal of the second operational amplifier being supplied with a second reference voltage, a first NMOS transistor having a gate disposed to be driven by an output from the first operational amplifier, a drain connected to the high-level power supply terminal, and a source connected to the other of the non-inverting input terminal and the inverting input terminal of one of the first operational amplifier and the second operational amplifier for feedback of an output from the one of the first operational amplifier and the second operational amplifier, a second NMOS transistor having a gate disposed to be driven by an output from the second operational amplifier, a source connected to the low-level power supply terminal, and a drain connected to the other of the non-inverting input terminal and the inverting input terminal of the other of the first operational amplifier and the second operational amplifier for feedback of an output from the other of the first operational amplifier and the second operational amplifier, and a resistance connected between the source of the first NMOS transistor and the drain of the second NMOS transistor, and a switching drive stage including a first signal input terminal, a second signal input terminal, a signal output terminal, at least one switching PMOS transistor having a gate connected to the first signal input terminal, and a drain connected to the signal output terminal, at least one switching NMOS transistor having a gate connected to the second signal input terminal, and a drain connected to the signal output terminal, at least one pull-up NMOS transistor connected between the at least one switching PMOS transistor and the high-level power supply terminal, and having a gate commonly connected to the gate of the first NMOS transistor, and at least one current source NMOS transistor connected between the at least one switching NMOS transistor and the low-level power supply terminal, and having a gate commonly connected to the gate of the second NMOS transistor.

In a first preferred form of the invention, the constant current driving circuit according to the present invention comprises a high-level power supply terminal, a low-level power supply terminal, a reference current source circuit including a first operational amplifier having a non-inverting input terminal and an inverting input terminal, the non-inverting input terminal being supplied with a first reference voltage, a second operational amplifier having a non-inverting input terminal and an inverting input terminal, the inverting input terminal being supplied with a second reference voltage which is lower than the first reference voltage, a first NMOS transistor having a gate disposed to be driven by an output from the first operational amplifier, a drain connected to the high-level power supply terminal, and a source connected to the inverting input terminal of the first operational amplifier for feedback of the output from the first operational amplifier, a second NMOS transistor having a gate disposed to be driven by an output from the second operational amplifier, a source connected to the low-level power supply terminal, and a drain connected to the non-inverting input terminal of the second operational amplifier for feedback of the output from the second operational amplifier, and a resistance connected between the source of the first NMOS transistor and the drain of the second NMOS transistor, and a switching drive stage including a first signal input terminal, a second signal input terminal, a signal output terminal, a switching PMOS transistor having a gate connected to the first signal input terminal, and a drain connected to the signal output terminal, a switching NMOS transistor having a gate connected to the second signal input terminal, and a drain connected to the signal output terminal, a pull-up NMOS transistor connected between the switching PMOS transistor and the high-level power supply terminal, and having a gate commonly connected to the gate of the first NMOS transistor, and a current source NMOS transistor connected between the switching NMOS transistor and the low-level power supply terminal, and having a gate commonly connected to the gate of the second NMOS transistor.

Preferably, the second NMOS transistor and the current source NMOS transistor have the same element parameter.

Also preferably, the first NMOS transistor and the pull-up NMOS transistor have the same element parameter, the pull-up NMOS transistor having a gate threshold voltage and a biasing condition set such that the pull-up NMOS transistor operates in a pinch-off region depending on a load condition of the constant current driving circuit.

According to the first preferred form of the invention, if the first reference voltage and second reference voltage applied to the first and second operational amplifiers, respectively, are designated by VREF1 and VREF2, respectively, a reference current $|I0=VREF1-VREF2|/R$ flows through the resistance R connected between the first and second NMOS transistors. Provided that the first and second reference voltages VREF1, VREF2 are not influenced by power supply variation, temperature variation and process variation, the reference current I0 is not influenced by these variations. The power supply variation, temperature variation and process variation will be hereinafter collectively referred to as "variations of the external conditions".

The current source NMOS transistor of the switching drive stage forms a current mirror circuit together with the second NMOS transistor, and therefore, when the switching NMOS transistor is on, a load current flows through the current source NMOS transistor, which is a constant current determined by the reference current I0, that is, it is not influenced by variations of the external conditions. Further, the first NMOS transistor has its gate commonly connected to the gate of the pull-up NMOS transistor of the switching drive stage to be driven together therewith. Therefore, if the first NMOS transistor and the pull-up NMOS transistor have the same element parameter and at the same time the gate threshold voltage and biasing condition of the pull-up NMOS transistor are set such that the pull-up NMOS transistor operates in the pinch-off region, a load current flows through the pull-up NMOS transistor, which is almost equal to the reference current I0.

The high-level voltage at the signal output terminal assumed when the switching PMOS transistor is on is limited to a value (VG−VTN) where VG represents the gate voltage of the pull-up NMOS transistor (=the gate voltage of the first NMOS transistor), and VTN the gate threshold voltage of the same. That is, the amplitude of the output signal can be set to a predetermined value smaller than the power supply voltage VDD by suitably designing the pull-up NMOS transistor and suitably setting the reference voltage VREF1.

In a second preferred form of the invention, the constant current driving circuit according to the present invention comprises a high-level power supply terminal, a low-level power supply terminal, a reference current source circuit including a first operational amplifier having a non-inverting input terminal and an inverting input terminal, the non-inverting input terminal being supplied with a first reference voltage, a second operational amplifier having a non-inverting input terminal and an inverting input terminal, the inverting input terminal being supplied with a second reference voltage which is lower than the first reference voltage, a first NMOS transistor having a gate disposed to be driven by an output from the first operational amplifier, a drain connected to the high-level power supply terminal, and a source connected to the-inverting input terminal of the first operational amplifier for feedback of the output from the first operational amplifier, a second NMOS transistor having a gate disposed to be driven by an output from the second operational amplifier, a source connected to the low-level power supply terminal, and a drain connected to the non-inverting input terminal of the second operational amplifier for feedback of the output from the second operational amplifier, and a resistance connected between the source of the first NMOS transistor and the drain of the second NMOS transistor, a differential switching drive stage including a pair of complementary signal input terminals, a first switching NMOS transistor having a source connected to a first terminal of a load, and a gate, a second switching NMOS transistor having a drain connected to the first terminal of the load, and a gate, the gates of the first and second switching NMOS transistors being connected to respective ones of the complementary signal input terminals to be driven in a selective manner by complementary input signals, a third switching NMOS transistor having a source connected to a second terminal of the load, and a gate, a fourth NMOS transistor having a drain connected to the second terminal of the load, and a gate, the gates of the third and fourth switching NMOS transistors being connected to respective ones of the complementary signal input terminals to be driven in a selective manner by the complementary input signals, first and second PMOS transistors connected between respective ones of the first and third switching NMOS transistors and the high-level power supply terminal, and each having a gate and a drain, a pair of pull-up NMOS transistors connected between respective ones of the first and second PMOS transistors and the high-level power supply terminal, and each having a gate commonly connected to the gate of the first NMOS transistor to be driven together therewith, and a pair of current source NMOS transistors connected between respective ones of the second and fourth switching NMOS transistors and the low-level power supply terminal, and each having a gate commonly connected to the gate of the second NMOS transistor to be driven together therewith, and a bias circuit including a third NMOS transistor having a gate commonly connected to the gate of the first NMOS transistor to be driven together therewith, and a drain connected to the high-level power supply terminal, a fourth NMOS transistor having a gate commonly connected to the gate of the second NMOS transistor to be driven together therewith, and a drain connected to the low-level power supply terminal, and a third PMOS transistor connected between the third and fourth NMOS transistors, and having a gate and a drain thereof short-circuited, the gate and the drain of the third PMOS transistor being connected to the gates of the first and second PMOS transistors.

Preferably, the second and fourth NMOS transistors and the pair of the current source NMOS transistors have the same element parameter.

Also preferably, the first and third NMOS transistors and the pair of the pull-up NMOS transistors have the same element parameter.

More preferably, the first, second and third PMOS transistors have the same element parameter.

According to the second preferred form of the invention, including a differential switching drive stage, a constant current characteristic which is not influenced by variations of the external conditions is obtained for the same reason as described with respect to the first preferred form. Further, the amplitude of the output voltage applied on the load can be limited by inserting the PMOS transistors on the high-level power supply terminal side of the differential switching drive stage. Still further, by using the bias circuit including the third PMOS transistor for biasing the two PMOS transistors of the differential switching drive stage, the influences of output voltage amplitude variation, temperature variation and process variation on the load can be eliminated.

In an alternative form of the invention to the first and second preferred forms, the reference current source circuit includes a first operational amplifier having a non-inverting input terminal and an inverting input terminal, the non-inverting input terminal being supplied with a first reference voltage, a second operational amplifier having a non-inverting input terminal and an inverting input terminal, the inverting input terminal being supplied with a second reference voltage which is higher than the first reference voltage, a first NMOS transistor having a gate disposed to be driven by an output from the first operational amplifier, a drain connected to the high-level power supply terminal, and a source connected to the non-inverting input terminal of the second operational amplifier for feedback of an output from the second operational amplifier, a second NMOS transistor having a gate disposed to be driven by the output from the second operational amplifier, a source connected to the low-level power supply terminal, and a drain connected to the inverting input terminal of the first operational amplifier for feedback of the output from the first operational amplifier, and a resistance connected between the source of the first NMOS transistor and the drain of the second NMOS transistor.

The above and other objects, features, and advantages of the invention will be more apparent from the following detailed description taken in conjunction with the accompanying drawings.

DETAILED DESCRIPTION

The invention will now be described in detail with reference to the drawings showing embodiments thereof.

Figure 3:
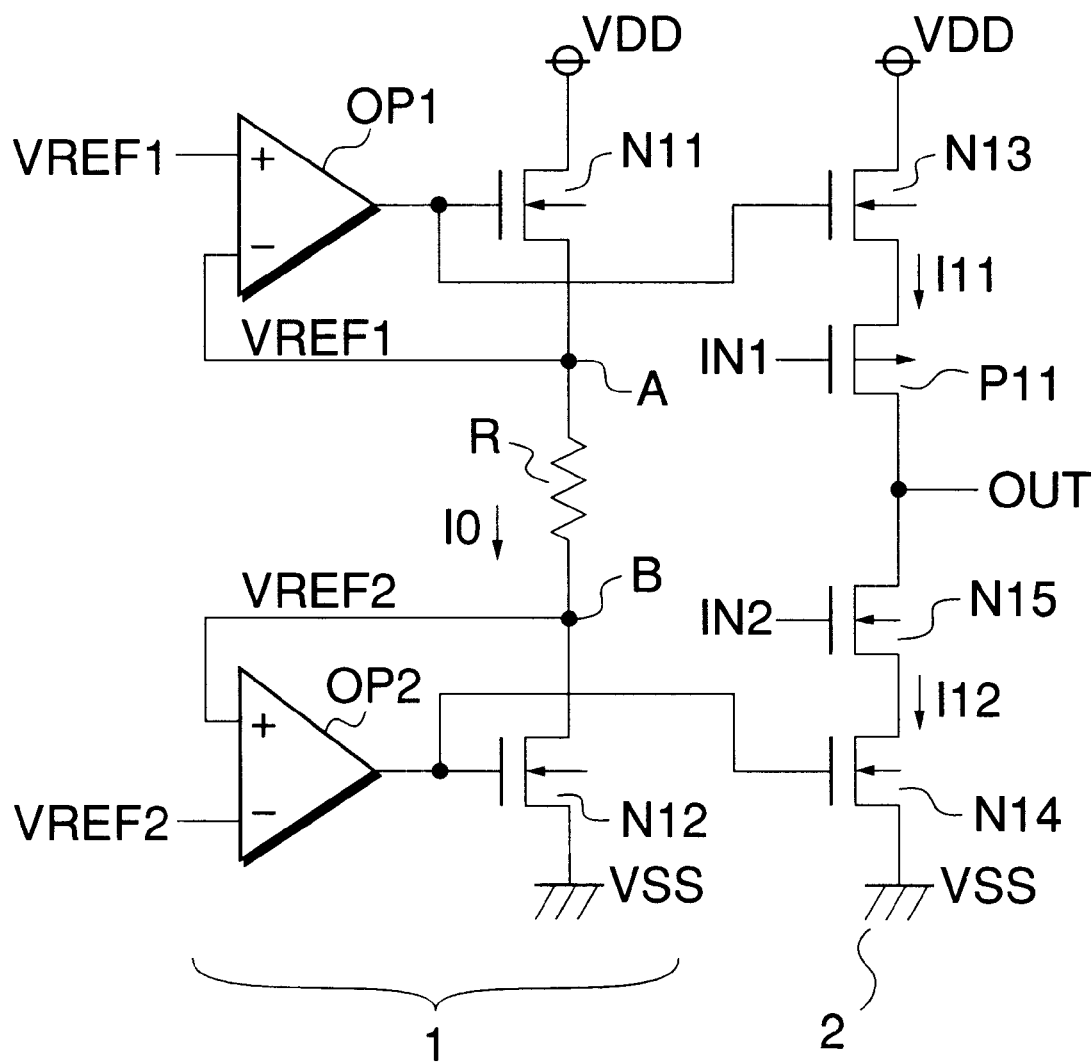
FIG. 3 is a diagram showing the circuit arrangement of a constant current driving circuit according to a first embodiment of the invention.

Referring first to FIG. 3, there is illustrated the circuit arrangement of a constant current driving circuit according to a first embodiment of the invention. In the figure, reference numeral 1 designates a reference current source circuit which is comprised of first and second operational amplifiers OP1 and OP2, first and second NMOS transistors N11 and N12 driven by the operational amplifiers OP1 and OP2, respectively, and a resistance R. The first operational amplifier OP1 has a non-inverting input terminal thereof supplied with a first reference voltage VREF1. The first NMOS transistor N11 has its gate connected to an output terminal of the first operational amplifier OP1 to be driven by an output therefrom, its drain connected to a high (H)-level power supply terminal VDD, and its source (terminal A) connected to an inverting input terminal of the first operational amplifier OP1 for feedback of the output. The second operational amplifier OP2 has an inverting input terminal thereof supplied with a second reference voltage VREF2 which is lower than the first reference voltage VREF1. The second NMOS transistor N12 has its gate connected to an output terminal of the operational amplifier OP2 to be driven by an output therefrom, its source connected to a low (L)-level power supply terminal (grounding terminal) VSS, and its drain (terminal B) connected to a non-inverting input terminal of the second operational amplifier OP2 for feedback of the output. The resistance R is connected between the terminals A and B.

In the reference current source circuit 1, provided that the first and second reference voltages VREF1 and VREF2 are constant irrespective of the external conditions, voltages at the terminals A and B become equal to the voltages VREF1 and VREF2, respectively, due to negative feedback operations of the first and second NMOS transistors N11 and N12, respectively. Accordingly, constant reference current I0=(VREF1−VREF2)/R flows through the resistance R irrespective of variations of the external conditions.

The reference current source circuit 1 constructed as above controls a switching drive stage 2 which is comprised of a pull-up NMOS transistor N13, a switching PMOS transistor P11, a switching MMOS transistor N15, and a current source NMOS transistor N14, the transistors being serially connected to each other. The NMOS transistor N13 has its gate commonly connected to the gate of the first NMOS transistor N11. The switching PMOS transistor P11 has its gate connected to a first signal input terminal IN1, its drain to a signal output terminal OUT, and its source to the power supply terminal VDD via the pull-up NMOS transistor N13. On the other hand, the switching NMOS transistor N15 has its gate connected to a second signal input terminal IN2, its drain to the signal output terminal OUT, and its source to the low-level supply source terminal VSS via the current source NMOS transistor N14. The NMOS transistor N14 has its gate commonly connected to the gate of the second NMOS transistor N12.

Figure 1:
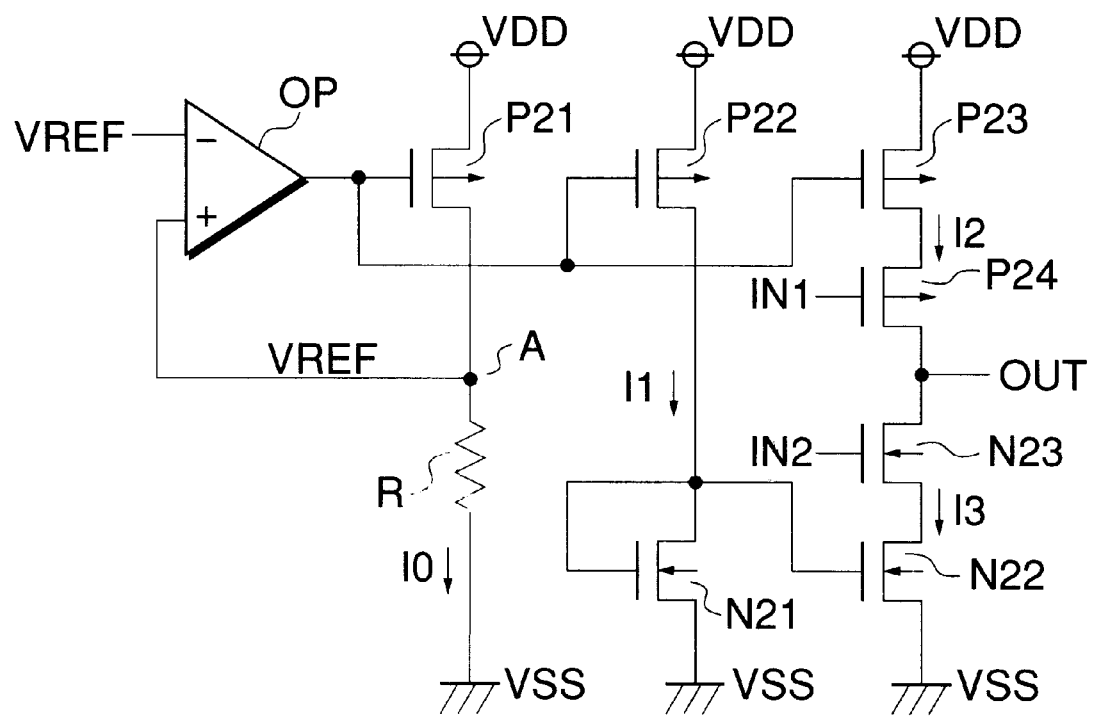
FIG. 1 is a diagram showing the circuit arrangement of a constant current driving circuit according to the prior art.

The constant current driving circuit according to the present embodiment operates basically in the same manner as the circuit according to the prior art shown in FIG. 1. When first and second signals at the input terminals IN1 and IN2 are both at a low level ("L" level), the switching PMOS transistor P11 is on while the switching NMOS transistor N15 is off, whereby a load connected to the output terminal OUT is charged. When the first and second signals at the input terminals IN1 and IN2 are both at a high level ("H" level), the switching PMOS transistor P11 is off while the switching NMOS transistor N15 is on, whereby the load is discharged. On the other hand, when the first signal at the input terminal IN1 is at "H" level and the second signal at the input terminal IN2 is at "L" level, the switching PMOS transistor P11 and the switching NMOS transistor N15 are both off and held on standby.

The second NMOS transistor N12 of the reference current source circuit 1 has the same gate-source voltage as that of the current source NMOS transistor N14 of the switching drive stage 2. Therefore, provided that these transistors N12 and N14 have the same element size (element parameter), a load discharging current I12 flowing through the NMOS transistors N15 and N14 is equal to the reference current I0 flowing through the resistance R. That is, the load discharging current is always constant irrespective of variations of the external conditions.

On the other hand, the first NMOS transistor N11 of the reference current source circuit 1 does not always have the same gate-source voltage as that of the pull-up NMOS transistor N13 of the switching drive stage 2. However, if these transistors N11 and N13 have the same element size and at the same time the gate threshold voltage and the biasing condition are set such that the third NMOS transistor N13 operates in a pinch-off region depending on the load condition, a load charging current I11 flowing through the NMOS transistor N13 and the PMOS transistor P11 becomes almost equal to the reference current I0 without being influenced by the of load variation and power supply variation.

Figure 2:
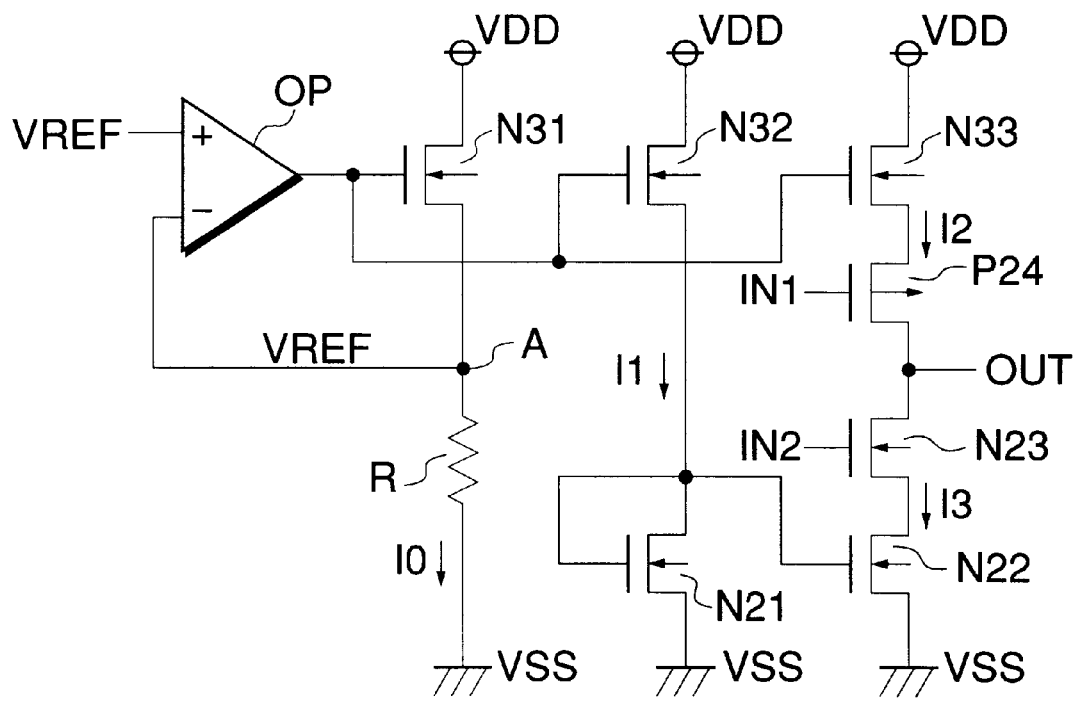
FIG. 2 shows a variation of the circuit arrangement of the FIG. 2 circuit.

As described hereinabove, although the load charging current I11 is influenced by the load condition, the load discharging current I12 is free from the influence of the load condition and at the same time equal to the reference current I0 which is free from variations of the external conditions. As a result, the constant current driving circuit according to the present embodiment is superior in constant current characteristic to the circuit of the prior art shown in FIG. 2.

When there occurs a flow of the load charging current I11 so that the output at the output terminal OUT goes high, the "H" level voltage at the output terminal OUT is equal to a value (VG−VTN) where VTN represents the gate threshold voltage of the NMOS transistor N13, and VG the gate voltage. That is, the "H" level voltage at the output terminal OUT is limited in amplitude to a value lower than the power supply voltage VDD.

Further, provided that a ratio of a size ratio W/L (ratio between the channel width W and the channel length L, and hereinafter referred to as "the W/L ratio") of the pull-up NMOS transistor N13 to the W/L ratio of the first NMOS transistor N11 is designated by n and a ratio of the W/L ratio of the current source NMOS transistor N14 to the W/L ratio of the second NMOS transistor N12 is designated by n, the load charging and discharging currents satisfy the relationship of I11=I12=n×I0.

Figure 4:
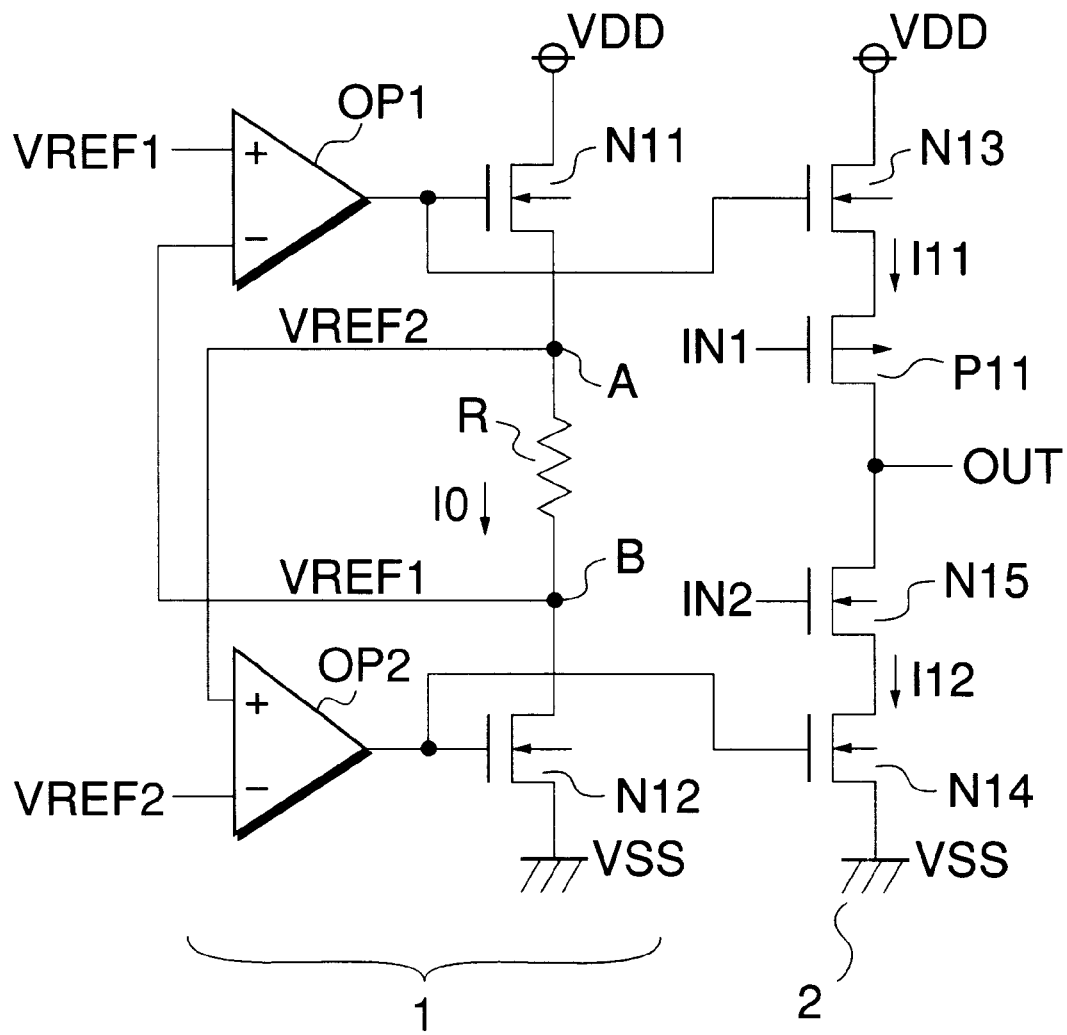
FIG. 4 is a diagram showing the circuit arrangement of a second embodiment of the invention.

FIG. 4 shows the circuit arrangement of a constant current driving circuit according to a second embodiment of the invention, which is distinguished from the first embodiment in the connection of the reference current source circuit 1. In the present embodiment, the first reference voltage VREF1 applied to the first operational amplifier OP1 is set to a lower value than the second reference voltage VREF2 applied to the second operational amplifier OP2. In the present embodiment, the drain of the second NMOS transistor N12, i.e the terminal B is connected to the inverting input terminal of the first operational amplifier OP1, while the source of the first NMOS transistor N11, i.e. the terminal A is connected to the non-inverting input terminal of the second operational amplifier OP2.

With this intersecting connection for feedback of the operational amplifier outputs, constant reference current I0=(VREF2=VREF1)/R flows through the resistance R. Except for this, the present embodiment is identical with the first embodiment in arrangement as well as in operation. Therefore, substantially the same effects as in the first embodiment can be achieved.

Figure 5:
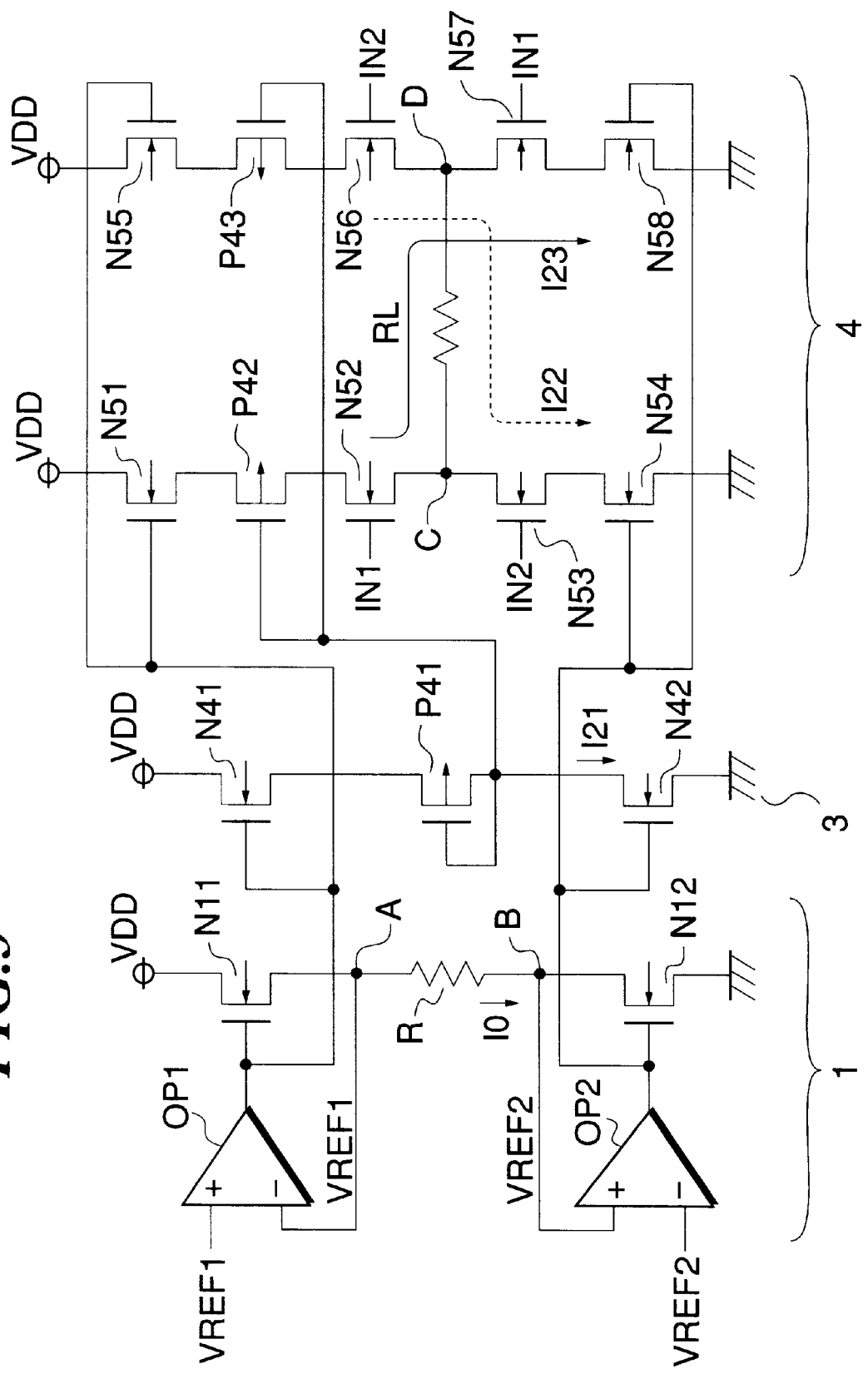
FIG. 5 is a diagram showing the circuit arrangement of a third embodiment of the invention.

FIG. 5 shows the circuit arrangement according to a third embodiment of the invention, which has a differential switching drive stage. The arrangement of the reference current source circuit 1 is identical with that of the first embodiment of FIG. 3. The differential switching drive stage 4, which is controlled by the reference current source circuit 1, includes first to fourth switching NMOS transistors N52, N53, N56, and N57. The first switching NMOS transistor N52 has its source connected to a terminal C of a load RL, and the second switching NMOS transistor N53 has its drain connected to the terminal C. Further, the gates of the NMOS transistors N52 and N53 are driven in a selective or complementary manner by complementary signal input terminals IN1 and IN2, respectively. The third switching NMOS transistor N56 has its source connected to the other terminal D of the load RL, and the fourth switching NMOS transistor N57 has its drain connected to the terminal D. Further, the gates of the transistors N56 and N57 are driven in a selective or complementary manner by the complementary signal input terminals IN2 and IN1, respectively.

Serially connected between respective ones of the first and third switching NMOS transistors N52 and N56 and the power supply terminal VDD are a pair of pull-up NMOS transistors N51 and N55 and a pair of first and second PMOS transistors P42 and P43, in this order as viewed from the VDD side. These pull-up NMOS transistors N51 and N55 have their gates commonly connected to and driven together with the gate of the first NMOS transistor N11 of the reference current source circuit 1. Further, serially connected between respective ones of the second and fourth switching NMOS transistors N53 and N57 and the grounding terminal VSS are a pair of current source NMOS transistors N54 and N58 which have their gates commonly connected to and driven together with the gate of the second NMOS transistor N12 of the reference current source circuit 1.

A bias circuit 3 is provided in order to apply a predetermined bias voltage to the PMOS transistors P42 and P43 of the differential switching drive stage 4. The bias circuit 3 is comprised of a third NMOS transistor N41, a fourth NMOS transistor N42, and a third PMOS transistor P41. The third NMOS transistor N41 has its gate commonly connected to and driven together with the gate of the first NMOS transistor N11, and its drain connected to the power supply terminal VDD. The fourth NMOS transistor N42 has its gate commonly connected to and driven together with the gate of the second NMOS transistor N12, and its source connected to the grounding terminal VSS. The third PMOS transistor P41 is connected between the NMOS transistors N41 and N42 in a saturation connection (diode connection) with its gate and drain short-circuited. The gate and drain of the PMOS transistor P41 are connected to the gates of the PMOS transistors P42 and P43 of the differential switching drive stage 4.

With the above arrangement of the third embodiment, when first and second signals input to the complementary input terminals IN1 and IN2 are at "H" and "L" levels, respectively, the switching NMOS transistors N52 and N57 are on and the switching NMOS transistors N53 and N56 are off, whereby a current I23 flows through the load RL as indicated by the solid line. On the other hand, when the first and second signals input to the complementary input terminal IN1 and IN2 are at "L" and "H" levels, respectively, a current I22 flows through the load RL as indicated by the broken line.

Figure 6A:
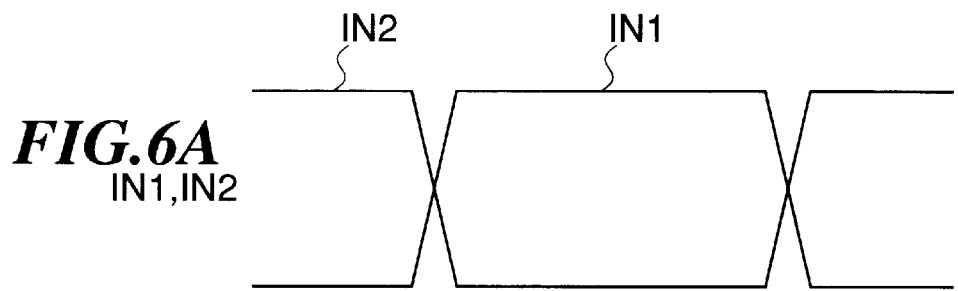
FIG. 6A shows waveforms of input signals IN1 and IN2 input to the FIG. 5 circuit.
Figure 6B:
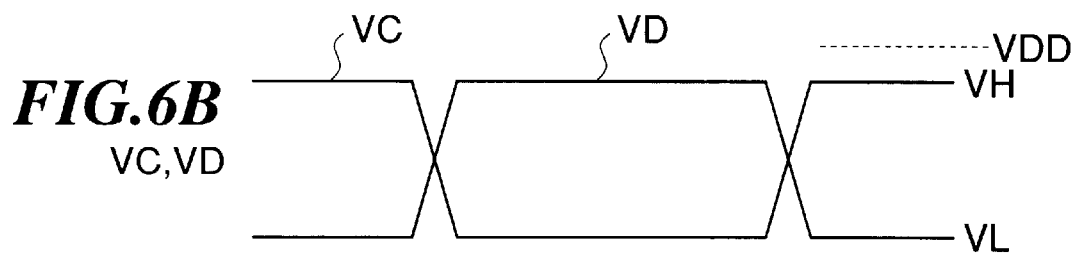
FIG. 6B shows waveforms of voltages VC and VD at output terminals C and D appearing in FIG. 5.
Figure 6C:
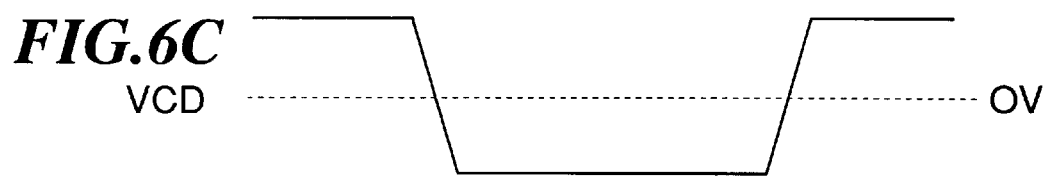
FIG. 6C shows a waveform of differential voltage VCD.

FIGS. 6A to 6C show waveforms of the first and second signals IN1 and IN2, voltages VC and VD at the respective terminals C and D, and a differential voltage VCD between the voltages VC and VD, respectively.

In the present embodiment, the NMOS transistors N12, N42, N54 and N58 have their gates commonly connected together to form a current mirror circuit. Therefore, provided that these NMOS transistors have the same element size, a current I21 flowing through the bias circuit 3, and the currents I22 and I23 flowing through the load RL by the differential switching drive stage 4 are all constant, i.e. equal to the reference current I0. That is, the current flowing through the load is free from the influence of variations of the external conditions.

The "H" level voltage VH assumed at each of the terminals C and D of the load RL, shown in FIG. 6B, is lower than the power supply voltage VDD by the sum of a voltage drop across each of the pull-up NMOS transistors N51 and N55 and a voltage drop across each of the PMOS transistors P42 and P43. The voltage drops across the PMOS transistors P42 and P43 occurring when the respective constant currents I22 and I23 flow through the load RL are determined by a voltage drop across the saturation-connected PMOS transistor P41 of the bias circuit 3. Provided that these PMOS transistors P42, P43, and P41 have the same element size and each have a threshold voltage VTP including a back bias effect, the voltage drop across each of the PMOS transistors P42, P43, and P41 is equal to a value |TP| when a certain level or more of current flows therethrough.

On the other hand, the pull-up NMOS transistors N51 and N55 have their gates commonly connected to and driven together with the gate of the NMOS transistor N11. If the reference voltage VREF1 is close to the power supply voltage VDD, gate voltage VG at these NMOS transistors is equal to the power supply voltage VDD. Therefore, provided that the NMOS transistors N11, N41, N51 and N55 have the same element size and each have a threshold voltage VTN including a back bias effect, the voltage drop across each of the pull-up NMOS transistors N51 and N55 is almost equal to the value VTN when certain levels or more of constant currents I23 and I22 flow. Accordingly, the "H" level voltage VH satisfies the relationship of VH=VDD−VTN−|TP|.

According to the third embodiment, the load is driven with a constant current while the "H" level voltage VH, i.e. the amplitude of the differential voltage VCD applied on the load, is suppressed. As is apparent from the above relationship of VH=VDD−VTN−|TP| the "H" level voltage VH is influenced by power supply variation. With respect to temperature variation and process variation, however, the threshold voltage VTN of the NMOS transistors varies inversely to the threshold voltage |TP| of the PMOS transistors, and consequently the temperature variation and process variation are offset, whereby the "H" level voltage VH is held at an almost constant value.

In the present embodiment as well, by selecting a ratio of the size ratio W/L of each of the current source NMOS transistors N54 and N58 of the differential switching drive stage 4 to the size ratio W/L of the NMOS transistor N12 of the reference current source circuit 1, the ratio of the currents I22 and I23 to be supplied to the load RL to the reference current I0 can be suitably set. It is preferable, however, that the VSS-side NMOS transistor N42 of the bias circuit 3 and the VSS-side NMOS transistors N54 and N58 of the differential switching drive stage have the same element size, the VDD-side NMOS transistor N41 of the bias circuit 3 and the VDD-side NMOS transistors N51 and N55 of the differential switching drive stage have the same element size, and the PMOS transistors P41, P42, and P43 have the same element size.

Figure 7:
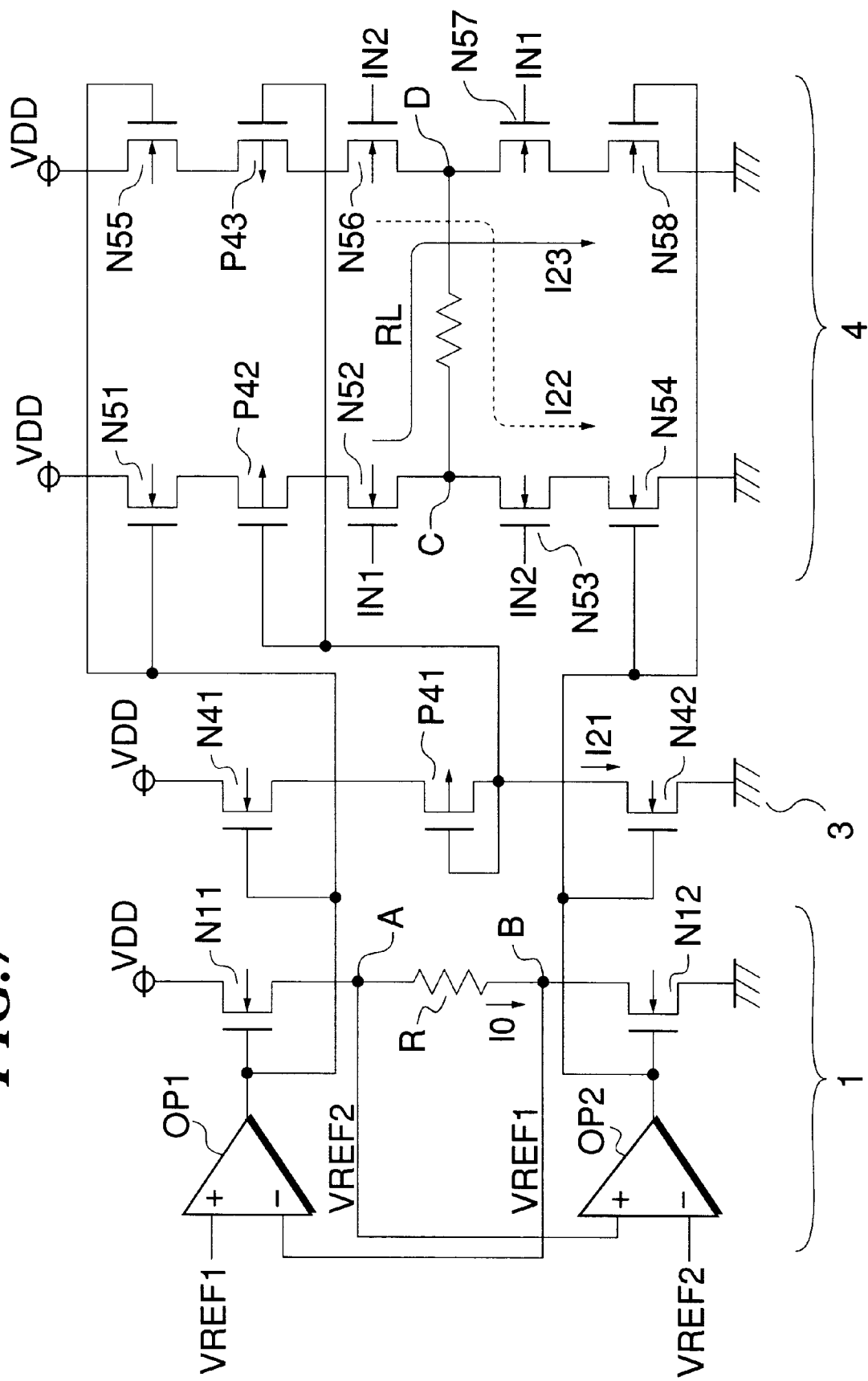
FIG. 7 is a diagram showing the circuit arrangement of a fourth embodiment of the invention.

FIG. 7 shows the circuit arrangement according to a fourth embodiment of the invention. This circuit is distinguished from the third embodiment shown in FIG. 5 in that the first reference voltage VREF1 is set to a lower value than the second reference voltage VREF2, and the connection between the input terminals of the operational amplifiers OP1 and OP2 and NMOS transistors N11 and N12 of the reference current source circuit 1 is made in an intersecting fashion, similarly to the second embodiment shown in FIG. 4. Even with this intersecting connection, substantially the same effects as in the third embodiment can be obtained.

what is claimed is:

1. A constant current driving circuit comprising:
   a high-level power supply terminal;
   a low-level power supply terminal;
   a reference current source circuit including a first operational amplifier having a non-inverting input terminal and an inverting input terminal, one of said non-inverting input terminal and said inverting input terminal being supplied with a first reference voltage, a second operational amplifier having a non-inverting input terminal and an inverting input terminal, one of said non-inverting input terminal and said inverting input terminal of said second operational amplifier being supplied with a second reference voltage, a first NMOS transistor having a gate disposed to be driven by an output from said first operational amplifier, a drain connected to said high-level power supply terminal, and a source connected to the other of said non-inverting input terminal and said inverting input terminal of one of said first operational amplifier and said second operational amplifier for feedback of an output from said one of said first operational amplifier and said second operational amplifier, a second NMOS transistor having a gate disposed to be driven by an output from said second operational amplifier, a source connected to said low-level power supply terminal, and a drain connected to the other of said non-inverting input terminal and said inverting input terminal of the other of said first operational amplifier and said second operational amplifier for feedback of an output from the other of said first operational amplifier and said second operational amplifier, and a resistance connected between said source of said first NMOS transistor and said drain of said second NMOS transistor; and
   a switching drive stage including a first signal input terminal, a second signal input terminal, a signal output terminal, at least one switching PMOS transistor having a gate connected to said first signal input terminal, and a drain connected to said signal output terminal, at least one switching NMOS transistor having a gate connected to said second signal input terminal, and a drain connected to said signal output terminal, at least one pull-up NMOS transistor connected between said at least one switching PMOS transistor and said high-level power supply terminal, and having a gate commonly connected to said gate of said first NMOS transistor, and at least one current source NMOS transistor connected between said at least one switching NMOS transistor and said low-level power supply terminal, and having a gate commonly connected to said gate of said second NMOS transistor.

2. A constant current driving circuit comprising:
   a high-level power supply terminal;
   a low-level power supply terminal;
   a reference current source circuit including a first operational amplifier having a non-inverting input terminal and an inverting input terminal, said non-inverting input terminal being supplied with a first reference voltage, a second operational amplifier having a non-inverting input terminal and an inverting input terminal, said inverting input terminal being supplied with a second reference voltage which is lower than said first reference voltage, a first NMOS transistor having a gate disposed to be driven by an output from said first operational amplifier, a drain connected to said high-level power supply terminal, and a source connected to said inverting input terminal of said first operational amplifier for feedback of said output from said first operational amplifier, a second NMOS transistor having a gate disposed to be driven by an output from said second operational amplifier, a source connected to said low-level power supply terminal, and a drain connected to said non-inverting input terminal of said second operational amplifier for feedback of said output from said second operational amplifier, and a resistance connected between said source of said first NMOS transistor and said drain of said second NMOS transistor; and
   a switching drive stage including a first signal input terminal, a second signal input terminal, a signal output terminal, a switching PMOS transistor having a gate connected to said first signal input terminal, and a drain connected to said signal output terminal, a switching NMOS transistor having a gate connected to said second signal input terminal, and a drain connected to said signal output terminal, a pull-up NMOS transistor connected between said switching PMOS transistor and said high-level power supply terminal, and having a gate commonly connected to said gate of said first NMOS transistor, and a current source NMOS transistor connected between said switching NMOS transistor and said low-level power supply terminal, and having a gate commonly connected to said gate of said second NMOS transistor.

3. A constant current driving circuit as claimed in claim 2, wherein said second NMOS transistor and said current source NMOS transistor have the same element parameter.

4. A constant current driving circuit as claimed in claim 2, wherein said first NMOS transistor and said pull-up NMOS transistor have the same element parameter, said pull-up NMOS transistor having a gate threshold voltage and a biasing condition set such that said pull-up NMOS transistor operates in a pinch-off region depending on a load condition of said constant current driving circuit.

5. A constant current driving circuit comprising:
   a high-level power supply terminal;
   a low-level power supply terminal;
   a reference current source circuit including a first operational amplifier having a non-inverting input terminal and an inverting input terminal, said non-inverting input terminal being supplied with a first reference voltage, a second operational amplifier having a non-inverting input terminal and an inverting input terminal, said inverting input terminal being supplied with a second reference voltage which is higher than said first reference voltage, a first NMOS transistor having a gate disposed to be driven by an output from said first operational amplifier, a drain connected to said high-level power supply terminal, and a source connected to said non-inverting input terminal of said second operational amplifier for feedback of an output from said second operational amplifier, a second NMOS transistor having a gate disposed to be driven by said output from said second operational amplifier, a source connected to said low-level power supply terminal, and a drain connected to said inverting input terminal of said first operational amplifier for feedback of said output from said first operational amplifier, and a resistance connected between said source of said first NMOS transistor and said drain of said second NMOS transistor; and a switching drive stage including a first signal input terminal, a second signal input terminal, a signal output terminal, a switching PMOS transistor having a gate connected to said first signal input terminal, and a drain connected to said signal output terminal, a switching NMOS transistor having a gate connected to said second signal input terminal, and a drain connected to said signal output terminal, a pull-up NMOS transistor connected between said switching PMOS transistor and said high-level power supply terminal, and having a gate commonly connected to said gate of said first NMOS transistor, and a current source NMOS transistor connected between said switching NMOS transistor and said low-level power supply terminal, and having a gate commonly connected to said gate of said second NMOS transistor.

6. A constant current driving circuit as claimed in claim 5, wherein said second NMOS transistor and said current source NMOS transistor have the same element parameter.

7. A constant current driving circuit as claimed in claim 5, wherein said first NMOS transistor and said pull-up NMOS transistor have the same element parameter, said pull-up NMOS transistor having a gate threshold voltage and a biasing condition set such that said pull-up NMOS transistor operates in a pinch-off region depending on a load condition of said constant current driving circuit.

8. A constant current driving circuit comprising:

a high-level power supply terminal;

a low-level power supply terminal;

a reference current source circuit including a first operational amplifier having a non-inverting input terminal and an inverting input terminal, said non-inverting input terminal being supplied with a first reference voltage, a second operational amplifier having a non-inverting input terminal and an inverting input terminal, said inverting input terminal being supplied with a second reference voltage which is lower than said first reference voltage, a first NMOS transistor having a gate disposed to be driven by an output from said first operational amplifier, a drain connected to said high-level power supply terminal, and a source connected to said inverting input terminal of said first operational amplifier for feedback of said output from said first operational amplifier, a second NMOS transistor having a gate disposed to be driven by an output from said second operational amplifier, a source connected to said low-level power supply terminal, and a drain connected to said non-inverting input terminal of said second operational amplifier for feedback of said output from said second operational amplifier, and a resistance connected between said source of said first NMOS transistor and said drain of said second NMOS transistor;

a differential switching drive stage including a pair of complementary signal input terminals, a first switching NMOS transistor having a source connected to a first terminal of a load, and a gate, a second switching NMOS transistor having a drain connected to said first terminal of said load, and a gate, said gates of said first and second switching NMOS transistors being connected to respective ones of said complementary signal input terminals to be driven in a selective manner by complementary input signals, a third switching NMOS transistor having a source connected to a second terminal of said load, and a gate, a fourth NMOS transistor having a drain connected to said second terminal of said load, and a gate, said gates of said third and fourth switching NMOS transistors being connected to respective ones of said complementary signal input terminals to be driven in a selective manner by said complementary input signals, first and second PMOS transistors connected between respective ones of said first and third switching NMOS transistors and said high-level power supply terminal, and each having a gate and a drain, a pair of pull-up NMOS transistors connected between respective ones of said first and second PMOS transistors and said high-level power supply terminal, and each having a gate commonly connected to said gate of said first NMOS transistor to be driven together therewith, and a pair of current source NMOS transistors connected between respective ones of said second and fourth switching NMOS transistors and said low-level power supply terminal, and each having a gate commonly connected to said gate of said second NMOS transistor to be driven together therewith; and a bias circuit including a third NMOS transistor having a gate commonly connected to said gate of said first NMOS transistor to be driven together therewith, and a drain connected to said high-level power supply terminal, a fourth NMOS transistor having a gate commonly connected to said gate of said second NMOS transistor to be driven together therewith, and a drain connected to said low-level power supply terminal, and a third PMOS transistor connected between said third and fourth NMOS transistors, and having a gate and a drain thereof short-circuited, said gate and said drain of said third PMOS transistor being connected to said gates of said first and second PMOS transistors.

9. A constant current driving circuit as claimed in claim 8, wherein said second and fourth NMOS transistors and said pair of said current source NMOS transistors have the same element parameter.

10. A constant current driving circuit as claimed in claim 8, wherein said first and third NMOS transistors and said pair of said pull-up NMOS transistors have the same element parameter.

11. A constant current driving circuit as claimed in claim 8, wherein said first, second and third PMOS transistors have the same element parameter.

12. A constant current driving circuit comprising:

a high-level power supply terminal;

a low-level power supply terminal;

a reference current source circuit including a first operational amplifier having a non-inverting input terminal and an inverting input terminal, said non-inverting input terminal being supplied with a first reference voltage, a second operational amplifier having a non-inverting input terminal and an inverting input terminal, said inverting input terminal being supplied with a second reference voltage which is higher than said first reference voltage, a first NMOS transistor having a gate disposed to be driven by an output from said first operational amplifier, a drain connected to said high-level power supply terminal, and a source connected to said non-inverting input terminal of said second operational amplifier for feedback of an output from said second operational amplifier, a second NMOS transistor having a gate disposed to be driven by said output from said second operational amplifier, a source connected to said low-level power supply terminal, and a drain connected to said inverting input terminal of said first operational amplifier for feedback of said output from said first operational amplifier, and a resistance connected between said source of said first NMOS transistor and said drain of said second NMOS transistor;

a differential switching drive stage including a pair of complementary signal input terminals, a first switching NMOS transistor having a source connected to a first terminal of a load, and a gate, a second switching NMOS transistor having a drain connected to said first terminal of said load, and a gate, said gates of said first and second switching NMOS transistors being connected to respective ones of said complementary signal input terminals to be driven in a selective manner by complementary input signals, a third switching NMOS transistor having a source connected to a second terminal of said load, and a gate, a fourth NMOS transistor having a drain connected to said second terminal of said load, and a gate, said gates of said third and fourth switching NMOS transistors being connected to respective ones of said complementary signal input terminals to be driven in a selective manner by said complementary input signals, first and second PMOS transistors connected between respective ones of said first and third switching NMOS transistors and said high-level power supply terminal, and each having a gate and a drain, a pair of pull-up NMOS transistors connected between respective ones of said first and second PMOS transistors and said high-level power supply terminal, and each having a gate commonly connected to said gate of said first NMOS transistor to be driven together therewith, and a pair of current source NMOS transistors connected between respective ones of said second and fourth switching NMOS transistors and said low-level power supply terminal, and each having a gate commonly connected to said gate of said second NMOS transistor to be driven together therewith; and a bias circuit including a third NMOS transistor having a gate commonly connected to said gate of said first NMOS transistor to be driven together therewith, and a drain connected to said high-level power supply terminal, a fourth NMOS transistor having a gate commonly connected to said gate of said second NMOS transistor to be driven together therewith, and a drain connected to said low-level power supply terminal, and a third PMOS transistor connected between said third and fourth NMOS transistors, and having a gate and a drain thereof short-circuited, said gate and said drain of said third PMOS transistor being connected to said gates of said first and second PMOS transistors.

13. A constant current driving circuit as claimed in claim 12, wherein said second and fourth NMOS transistors and said pair of said current source NMOS transistors have the same element parameter.

14. A constant current driving circuit as claimed in claim 12, wherein said first and third NMOS transistors and said pair of said pull-up NMOS transistors have the same element parameter.

15. A constant current driving circuit as claimed in claim 12, wherein said first, second and third PMOS transistors have the same element parameter.

* * * * *